United States Patent
Wang et al.

(10) Patent No.: US 8,854,106 B2
(45) Date of Patent: Oct. 7, 2014

(54) LEVEL SHIFTING CIRCUIT FOR HIGH VOLTAGE APPLICATIONS

(71) Applicant: STMicroelectronics R&D (Shanghai) Co. Ltd., Shanghai (CN)

(72) Inventors: Fei Wang, Shanghai (CN); Snow Qi, Shanghai (CN); Jackson Ding, Shanghai (CN)

(73) Assignee: STMicroelectronics R&D (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 13/925,032

(22) Filed: Jun. 24, 2013

(65) Prior Publication Data

US 2014/0009201 A1    Jan. 9, 2014

(30) Foreign Application Priority Data

Jul. 5, 2012    (CN) .......................... 2012 1 0239768

(51) Int. Cl.
*H03K 5/00*         (2006.01)
*H03K 19/0185*     (2006.01)

(52) U.S. Cl.
CPC .............................. *H03K 19/018514* (2013.01)
USPC ................................ 327/333; 326/62; 326/81

(58) Field of Classification Search
USPC ................... 326/62–63, 80–81; 327/306, 333
See application file for complete search history.

(56) References Cited

U.S. PATENT DOCUMENTS

| 6,674,302 B2 * | 1/2004 | Yen .................................. 326/30 |
| 7,145,324 B2 * | 12/2006 | Masters et al. ................. 324/169 |
| 7,495,470 B2 * | 2/2009 | Xiong et al. ..................... 326/30 |

* cited by examiner

*Primary Examiner* — Dinh Le
(74) *Attorney, Agent, or Firm* — Gardere Wynne Sewell LLP

(57) ABSTRACT

A level shifting circuit includes a current mirror that generates a first bias current and a second bias current (proportional to the first bias current with a first ratio). A first level shifter is coupled between a first input node (receiving a first input signal) and a first output node coupled to an input of the current mirror. The first level shifter applies a first voltage variation to the first input signal in response to the first bias current. A second level is coupled between a second input node (receiving a second input signal) and a second output node coupled to an output of the current mirror. The second level shifter applies a second voltage variation (associated with the first voltage variation) to the second input signal in response to the second bias current.

20 Claims, 3 Drawing Sheets

LEVEL SHIFTING CIRCUIT FOR HIGH VOLTAGE APPLICATIONS

PRIORITY CLAIM

This application claims priority from Chinese Application for Patent No. 201210239768.5 filed Jul. 5, 2012, the disclosure of which is incorporated by reference.

TECHNICAL FIELD

This invention relates generally to electronic circuits, and more particularly to a level shifting circuit for high voltage applications.

BACKGROUND

Recently, the need for a high voltage comparator or an operational amplifier with a wide adjustable threshold range is growing in electronic industry. This is because in various applications, such as automotive application, a battery voltage is always very high, for example 40V. Besides, such a chip is extremely required, which could monitor the currents of different types of external high voltage MOS transistors via their drain to source voltages. The drain to source voltages of the high voltage MOS transistors are usually above 3.3V. Therefore, how a comparator or an operational amplifier could operate properly and accurately with high input and reference voltages is extremely important.

In one possible solution in the prior art, a divider is applied in order to set the input and reference voltage into a typical CMOS operable range. However, for example, the divider may amplify the random offset noise within the comparator or the operational amplifier, which is severe when the input voltage is close to 0V. Also, a voltage level shift is not possible in the above solution.

SUMMARY

Thus, there is a need for a level shifting circuit enabling electronic devices such as a comparator or an operational amplifier to operate in high voltage applications with high accuracy.

In one embodiment, a circuit comprises a current mirror for generating a first bias current and a second bias current proportional to the first bias current with a first ratio; a first level shifter having a first input node for receiving a first input signal and a first output node, wherein the first level shifter is configured to apply a first voltage variation to the first input signal in response to the first bias current so as to output a first output signal at the first output node; and a second level shifter having a second input node for receiving a second input signal and a second output node, wherein the second level shifter is configured to apply a second voltage variation in association with the first voltage variation to the second input signal in response to the second bias current so as to output a second output signal at the second output node.

According to an embodiment, the first level shifter comprises a first resistor coupled between the first input node and the first output node, and the second level shifter comprises a second resistor coupled between the second input node and the second output node.

According to an embodiment, a resistance of the second resistor is proportional to that of the first resistor with a reciprocal of the first ratio.

According to an embodiment, the circuit further comprises a variable current supplier for providing a variable current to the current mirror to change the second voltage variation in relative to the first voltage variation.

According to an embodiment, the variable current supplier comprises a current source for generating a reference current, and a current multiplier for multiplying the reference current in response to a control signal, so as to provide the variable current.

According to an embodiment, the circuit further comprises a first overvoltage protector coupled between the second level shifter and the current mirror, and configured to provide overvoltage protection for the current mirror.

According to an embodiment, the current mirror comprises a first MOS transistor having a first gate, a first drain and a first source, and a second MOS transistor having a second gate, a second drain and a second source, wherein the first gate is coupled to the second gate and the first drain, the first source and the second source are coupled to a reference voltage line, and the first drain is coupled to the first level shifter to at least partially provide the first bias current, and the second drain is coupled to the second level shifter to provide the second bias current.

According to an embodiment, the circuit further comprises a comparator for comparing the first output signal with the second output signal.

According to an embodiment, the circuit further comprises a second overvoltage protector coupled between the second level shifter and the comparator and configured to provide overvoltage protection for the comparator.

According to an embodiment, the circuit further comprises an operational amplifier for amplifying a voltage difference between the first output signal and the second output signal.

With the preferable solutions mentioned above, a level shifting circuit enabling a comparator or an operational amplifier to have a wide adjustable threshold range and high accuracy, which mainly depends on the accuracy of the reference current or other possible reference and the match of current mirror and resistors, is accomplished.

Therefore, high accuracy in an integrated circuit under high voltage applications could be achieved. Besides, in the present invention, only a few high voltage components are required to realize a threshold voltage higher than 3.3V. Instead, 3.3V CMOS transistors are mainly employed. Thus, the silicon chip area taken up by the integrated circuit has been saved considerably. Moreover, the application of the present invention is very broad. For example, it could be used to monitor drain to source voltage of the external power MOS transistors, to compare any two nodes whose voltage are influenced by the current of a comparator and the like. Also, the noise at the input of the comparator can be effectively suppressed in the whole typical CMOS operable range.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF THE DRAWINGS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 1:
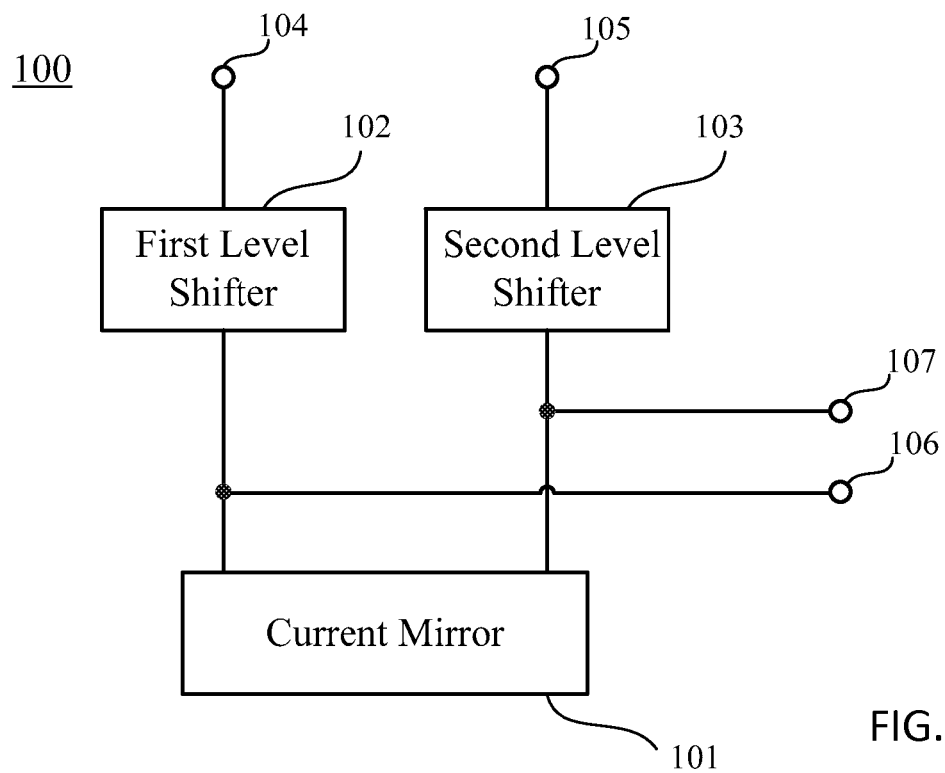
FIG. 1 shows a block diagram of a circuit 100 according to a first embodiment of the invention.

FIG. 1 shows a block diagram of a circuit 100 according to a first embodiment. The circuit 100 comprises a current mirror 101, a first level shifter 102 having a first input node 104 and a first output node 106, and a second level shifter 103 having a second input node 105 and a second output node 107. The circuit 100 is used to shift the voltage levels of a first input signal received at the first input node 104 and a second input signal received at the second input node 105 respectively, so as to output a first output signal associated with the first input signal at the first output node 106 and a second output signal associated with the second input signal at the second output node 107. With this circuit, the high voltage received at the first and second input nodes 104, 105 could be properly and accurately shifted to an adjustable and suitable voltage at the first and second output nodes 106, 107 respectively.

As shown in FIG. 1, the current mirror 101 is configured to generate a first bias current and a second bias current proportional to the first bias current with a first ratio. For example, the second bias current is a times the first bias current, wherein a could be a predetermined value such as 1. The first bias current and the second bias current generated by the current mirror 101 are provided to the first level shifter 102 and the second level shifter 103 respectively.

The first input node 104 of the first level shifter 102 is configured to receive the first input signal, for example, a reference signal. The second input node 105 of the second level shifter 103 is configured to receive the second input signal, for example, a sense signal, which could be obtained from some other equipment, for example, from some external high voltage power MOS transistors to be monitored. Specifically, the input signal may be signals of different voltage levels.

Still referring to FIG. 1, the first level shifter 102 is configured to apply a first voltage variation, a voltage drop, to the first input signal received at the first input node 104 in response to the first bias current provided by the current mirror 101, so as to output a first output signal at the first output node 106. The second level shifter 103 is configured to apply a second voltage variation, a voltage drop, to the second input signal received at the second input node 105 in response to the first bias current provided by the current mirror 101, so as to output a second output signal at the second output node 107. The second voltage variation is in association with the first voltage variation. For example, the second voltage variation is equal to the first voltage variation such that the first output signal at the first output node 106 is equal to the second output signal at the second output node 107.

The first level shifter 102 and/or the second level shifter 103 may comprise one or more resistors respectively. The total resistance of the one or more resistors of the second level shifter 103 is proportional to that of the one or more resistors of the first level shifter 102 with a reciprocal of the first ratio, that is, 1/α. Preferably, the first level shifter 102 comprises one resistor coupled between the first input node 104 and the first output node 106, and the second level shifter 103 comprises another resistor coupled between the second input node 105 and the second output node 107, which has a resistance proportional to the previous resistor with a reciprocal of the first ratio.

This circuit 100 can be used for a comparator or an operational amplifier whose power supply voltages are equal to or below 3.3V, for example. Specifically, the first output node 106 and the second output node 107 can be coupled to inputs of the comparator or the operational amplifier respectively. As a result, when the input voltages are higher than the power supply voltage for the comparator or the operational amplifier, the circuit 100 is able to shift the input voltages below their power supply voltage such that the comparator or operational amplifier can properly and accurately operate.

Figure 2:
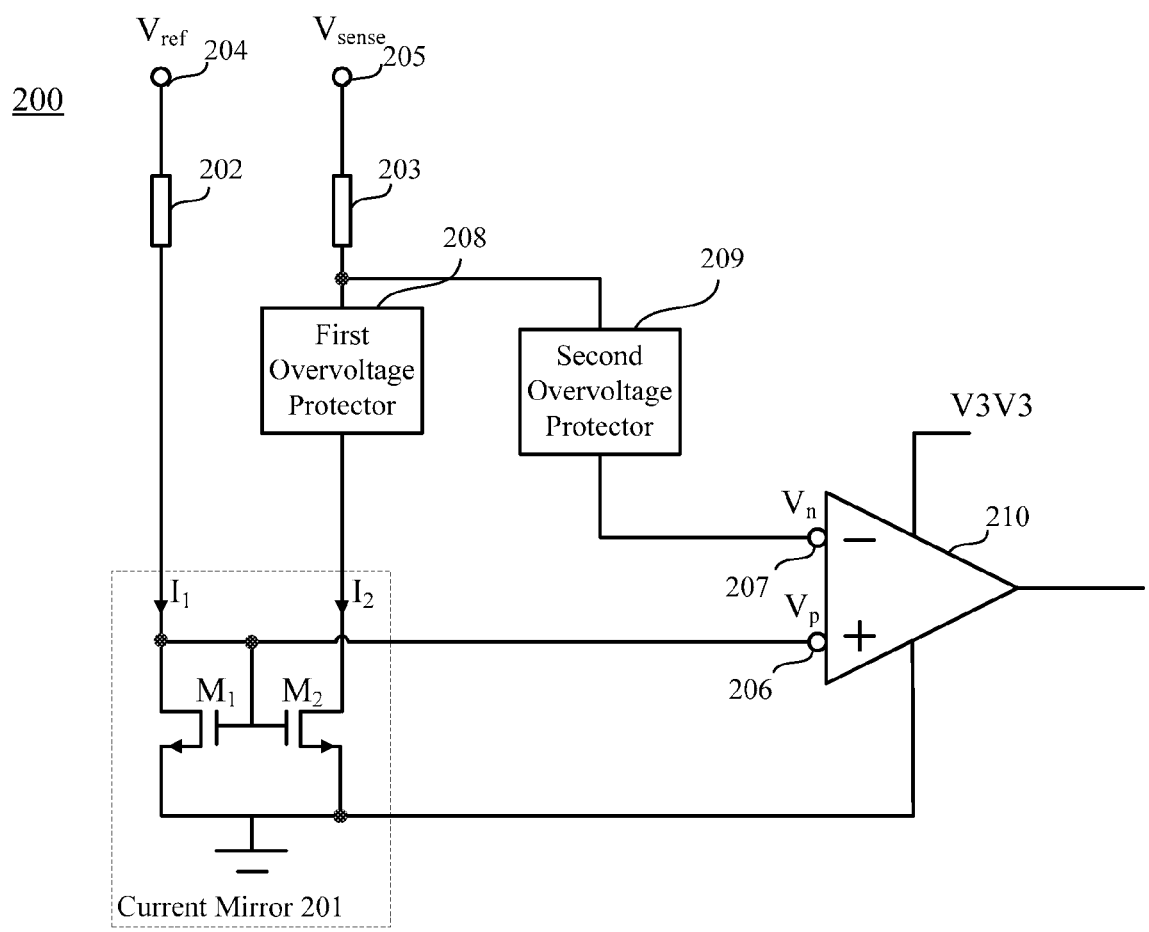
FIG. 2 shows a block diagram of a circuit 200 according to a second embodiment of the invention.

FIG. 2 shows a block diagram of a circuit 200 according to a second embodiment. The circuit 200 comprises a first level shifter 202, a second level shifter 203, a first MOS transistor $M_1$ and a second MOS transistor $M_2$. In this embodiment, the first and the second MOS transistors $M_1$ and $M_2$ form a current mirror 201 (as shown in the dash box). The first level shifter comprises a first resistor 202 coupled between a first input node 204 and a first output node 206, and the second level shifter comprises a second resistor 203 coupled between a second input node 205 and a second output node 207.

According to this embodiment, this circuit 200 further comprises a comparator 210, which is used to compare the first output signal with the second output signal. The first input node 204 is configured to receive a reference signal $V_{ref}$ and the second input node 205 is configured to receive a sense signal $V_{sense}$. The first output node 206 is configured to output a first output signal $V_p$, and the second output node 207 is configured to output a second output signal $V_n$.

Preferably, the circuit 200 may further comprise a first overvoltage protector 208 coupled between the second resistor 203 and the current mirror 201, and configured to provide overvoltage protection for the current mirror 201. For example, when the sense signal $V_{sense}$ at the second input node 205 is very high, the first overvoltage protector 208 could take over a large portion of the sense signal and protect the current mirror 201 from failure.

The circuit 200 may further comprise a second overvoltage protector 209 coupled between the resistor 203 and the comparator 210 and configured to provide overvoltage protection for the comparator 210. Similar to the first overvoltage protector 208, the second overvoltage protector 209 could take over a large portion of the sense signal and protect the comparator 210 from failure. For example, the first overvoltage protector 208 and the second overvoltage protector 209 may be a MOS transistor respectively. However, it will be appreciated for those skilled in the art, that any other suitable forms of the first overvoltage protector 208 and the second overvoltage protector 209 are also considerable.

In detail, the current mirror 201 comprises the first MOS transistor $M_1$ having a first gate, a first drain and a first source, and the second MOS transistor $M_2$ having a second gate, a second drain and a second source. The first gate is coupled to the second gate and the first drain. The first source and the second source are coupled to a reference voltage line such as ground. The first drain is coupled to the first resistor 202 ($R_1$) to provide a first bias current $I_1$, and the second drain is coupled to the second resistor 203 ($R_2$) via the first overvoltage protector 208 to provide a second bias current $I_2$.

In this embodiment, the relationship between the first bias current $I_1$ and the second bias current $I_2$ provided by the current mirror 201 is given by the following equation:

$$I_2 = \alpha I_1 \quad \text{(equation 1)}$$

Where $\alpha$ is a ratio of the second bias current $I_2$ to the first bias current $I_1$, preferably $\alpha = 1$.

In operation, when the reference signal $V_{ref}$ is higher than the gate to source voltage $V_{GS}$ of the first MOS transistor $M_1$, the first MOS transistor $M_1$ is turned on. Then the first bias current $I_1$ and the second bias current $I_2$, i.e. $\alpha I_1$, will be provided to the first resistor 202 and the second resistor 203 respectively by the current mirror 201.

On the other hand, according to this embodiment the relationship between the resistance of the first resistor 202 ($R_1$) and that of the second resistor 203 ($R_2$) is given by the following equation:

$$R_2 = R_1 / \alpha \quad \text{(equation 2)}$$

That is, the resistance of the second resistor 203 is proportional to that of the first resistor 202 with a reciprocal of the ratio of the second bias current $I_2$ to the first bias current From the above two equations, the following relationship among the first bias current $I_1$, the second bias current $I_2$, the resistance of the first resistor 202 and that of the second resistor 203 can be concluded as:

$$I_1 R_1 = I_2 R_2 \quad \text{(equation 3)}$$

Thus, the first voltage variation on the first resistor 202 is equal to the second voltage variation on the second resistor 203 in this embodiment.

Referring to FIG. 2, with the reference signal $V_{ref}$ received at the first input node 204 and the sense signal $V_{sense}$ received at the second input node 205, the first and second output voltages $V_p$ and $V_n$, which are provided to the input of the comparator 210, can be concluded as follows:

$$V_p = V_{ref} - I_1 R_1 \quad \text{(equation 4)}$$

$$V_n = V_{sense} - I_2 R_2 \quad \text{(equation 5)}$$

According to equations 3-5, a same level shift is applied to the reference signal $V_{ref}$ and the sense signal $V_{sense}$ respectively, which may reduce the reference signal $V_{ref}$ and the sense signal $V_{sense}$ into the operable range below 3.3V of the comparator 210.

With equation 3, the difference between the first and second output voltages $V_p$ and $V_n$ as indicated in equations 4 and 5 is obtained as follows:

$$V_p - V_n = V_{ref} - I_1 R_1 - (V_{sense} - I_2 R_2) = V_{ref} - V_{sense} \quad \text{(equation 6)}$$

The comparator 210 will operate according to the first and second output voltages $V_p$ and $V_n$. For example, when $V_n$ is higher than $V_p$, the output of the comparator 210 will reverse. Thus, from equation 6, it is obvious that with the circuit 200, the comparator 210 could be used to monitor the sense signal $V_{sense}$, which could come from different types of external high voltage MOS transistors and could be much higher than 3.3V. For example, an alarm signal for the monitored external high voltage MOS transistor will be output when the condition $V_{sense} > V_{ref}$ is satisfied, since at that point the reverse of the output of the comparator 210 can be observed.

In other words, with the specific configuration of this circuit 200, when $V_{sense} > V_{ref}$, the output of the comparator 210 will reverse, although $V_{sense}$ is much higher than 3.3V, i.e. the maximum operating voltage thereof.

Therefore, with the above configuration, a high voltage comparator is achieved. By choosing suitable resistances of the first resistor 202 and the second resistor 203, and setting the two bias currents correspondingly, i.e., by changing the voltage variation, the comparator could have a wide threshold range, which is beneficial for different application scenarios.

Moreover, the selection of the reference signal $V_{ref}$ could be based on practical applications, such as the high voltage MOS component required to be monitored, and it could be easily adjusted by the technician according to different application scenarios.

The circuit 200 also works when the reference signal $V_{ref}$ is lower than the gate to source voltage $V_{GS}$ of the first MOS transistor $M_1$. In this situation, the first MOS transistor $M_1$ is turned off, no current will flow through the first and the second MOS transistors $M_1$ and $M_2$, and no bias current will be provided by the first and the second MOS transistors $M_1$ and $M_2$, thus $V_p = V_{ref}$, $V_n = V_{sense}$. The comparator 210 will operate based on $V_p$ and $V_n$, (i.e. $V_{ref}$ and $V_{sense}$). Therefore, the circuit 200 also enables the comparator to compare input signals of low voltages.

Figure 3:
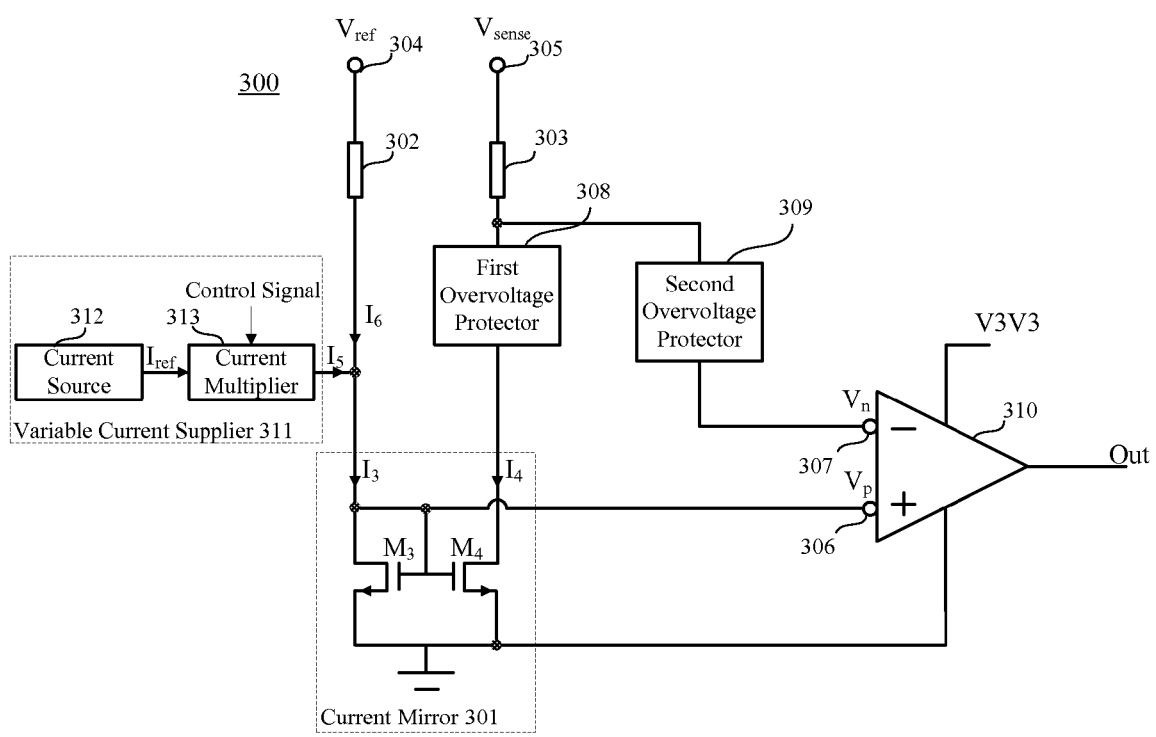
FIG. 3 shows a block diagram of a circuit 300 according to a third embodiment of the invention.

FIG. 3 shows a block diagram of a circuit 300 according to a third embodiment. The circuit 300 comprises a first level shifter, a second level shifter, a first MOS transistor $M_3$ and a second MOS transistor $M_4$. In this embodiment, the first and the second MOS transistors $M_3$ and $M_4$ form a current mirror 301 (as shown in the dash box). The first level shifter comprises a first resistor 302 coupled between a first input node 304 and a first output node 306, and the second level shifter comprises a second resistor 303 coupled between a second input node 305 and a second output node 307.

According to this embodiment, this circuit 300 further comprises a comparator 310, which is used to compare the first output signal with the second output signal. The first input node 304 is configured to receive a reference signal $V_{ref}$ and the second input node 305 is configured to receive a sense signal $V_{sense}$. The first output node 306 is configured to output a first output signal $V_p$, and the second output node 307 is configured to output a second output signal V.

Preferably, the circuit 300 may further comprise a first overvoltage protector 308 coupled between the second resistor 303 and the current mirror 301, and configured to provide overvoltage protection for the current mirror 301. For example, when the sense signal $V_{sense}$ at the second input node 305 is very high, the first overvoltage protector 308 could take over a large portion of the sense signal and protect the current mirror 301 from failure.

Besides, the circuit 300 may further comprise a second overvoltage protector 309 coupled between the resistor 303 and the comparator 310 and configured to provide overvoltage protection for the comparator 310. Similar to the first overvoltage protector 308, the second overvoltage protector 309 could take over a large portion of the sense signal and protect the comparator 310 from failure. For example, the first overvoltage protector 308 and the second overvoltage protector 309 may be a MOS transistor respectively. However, it will be appreciated for those skilled in the art, that any other suitable forms of the first overvoltage protector 308 and the second overvoltage protector 309 are also considerable.

As shown in FIG. 3, the circuit 300 further comprises a variable current supplier 311 for providing a variable current $I_5$ to the current mirror 301 to change the second voltage variation on the second resistor 303 in relative to the first voltage variation on the first resistor 302. Therefore, the first output signal $V_p$ may equal to the second output signal $V_n$ even under the situation in which the reference signal $V_{ref}$ and the sense signal $V_{sense}$ are different from each other.

According to this embodiment, the variable current supplier 311 may comprise a current source 312 and a current multiplier 313, for example.

The current source 312 is configured for generating a reference current $I_{ref}$. For example, the reference current $I_{ref}$ can be generated from a resistor biased by the band-gap voltage. Thus, the reference current $I_{ref}$ equals to $V_{BG}/R$, wherein R denotes a resistor, and $V_{BG}$ denotes the band-gap voltage.

Then the reference current $I_{ref}$ is provided to the current multiplier 313, which will multiply the reference current with a factor K in response to a control signal, so as to provide the variable current $I_5$. Thus, the following relationship could be obtained:

$$I_5 = K \times I_{ref} = K \times V_{BG}/R \quad \text{(equation 7)}$$

However, it will be appreciated for those skilled in the art that other suitable mechanisms, which could produce a variable current, are also suitable for this circuit.

In detail, the current mirror 301 comprises the first MOS transistor $M_3$ having a first gate, a first drain and a first source, and the second MOS transistor $M_4$ having a second gate, a second drain and a second source. The first gate is coupled to the second gate and the first drain. The first source and the second source are coupled to a reference voltage line such as ground. The first drain is coupled to the first resistor 302 ($R_3$) to at least partially provide a first bias current $I_3$, and the second drain is coupled to the second resistor 303 ($R_4$) via the first overvoltage protector 308 to provide a second bias current $I_4$.

In this embodiment, the relationship between the first bias current $I_3$ and the second bias current $I_4$ provided by the current mirror 301 is given by the following equation:

$$I_4 = \alpha I_3 \quad \text{(equation 8)}$$

Where $\alpha$ is a ratio of the second bias current $I_4$ to the first bias current $I_3$, preferably $\alpha=1$.

In operation, when the sum of the reference signal $V_{ref}$ and the $I_5 R_3$ (i.e. $V_{ref}+I_5 \times R_3$) is higher than the gate to source voltage $V_{GS}$ of the first MOS transistor $M_3$, the first MOS transistor $M_3$ is turned on. Then the first bias current $I_3$ and the second bias current $I_4$, i.e. $\alpha I_3$, will be generated respectively by the current mirror 301. Herein, the second bias current $I_4$ is the current flowing through the second resistor 303.

As shown in FIG. 3, the first bias current $I_3$ generated by the current mirror 301 includes the variable current $I_5$ and the current flowing through the first resistor 302 (i.e. $I_6$). That is, $I_3 = I_5 + I_6$.

Thus, based on equation 8, it is obtained that $$I_4 = \alpha(I_5 + I_6)$$

Therefore, $I_6 = I_4/\alpha - I_5 \quad \text{(equation 9)}$

On the other hand, according to this embodiment the relationship between the resistance of the first resistor 302 ($R_3$) and that of the second resistor 303 ($R_4$) is given by the following equation:

$$R_4 = R_3/\alpha \quad \text{(equation 10)}$$

That is, the resistance of the second resistor 303 is proportional to that of the first resistor 302 with a reciprocal of the ratio of the second bias current $I_4$ to the first bias current $I_3$.

From equations 9 and 10, the first voltage variation $V_1$ on the first resistor 302 is:

$$V_1 = I_6 R_3 = (I_4/\alpha - I_5)\alpha R_4 = I_4 R_4 - I_5 \alpha R_4 \quad \text{(equation 11)}$$

And the second voltage variation $V_2$ on the second resistor 303 is:

$$V_2 = I_4 R_4 \quad \text{(equation 12)}$$

Still referring to FIG. 3, based on equations 11 and 12, with the reference signal $V_{ref}$ received at the first input node 304 and the sense signal $V_{sense}$ received at the second input node 305, the first and second output voltages $V_p$ and $V_n$, which are provided to the input of the comparator 310, can be concluded as follows:

$$V_p = V_{ref} - V_1 = V_{ref} - I_4 R_4 + I_5 \alpha R_4 \quad \text{(equation 13)}$$

$$V_n = V_{sense} - V_2 = V_{sense} - I_4 R_4 \quad \text{(equation 14)}$$

According to equations 13-14, a level shift is applied to the reference signal $V_{ref}$ and the sense signal $V_{sense}$ respectively, which may reduce the reference signal $V_{ref}$ and the sense signal $V_{sense}$ into the operable range below 3.3V of the comparator 310.

The difference between the first and second output voltages $V_p$ and $V_n$ as indicated in equations 13 and 14 is obtained as follows:

$$V_p - V_n = V_{ref} - I_4 R_4 + I_5 \alpha R_4 - V_{sense} + I_4 R_4 = V_{ref} - V_{sense} + I_5 \alpha R_4 \quad \text{(equation 15)}$$

Since $I_5 = K \times I_{ref} = K \times V_{BG}/R$, equation 15 could be further deduced to:

$$V_p - V_n = V_{ref} - V_{sense} + K \times V_{BG}/R \times \alpha R_4 = V_{ref} - V_{sense} + K \times V_{BG}/R \times R_3 \quad \text{(equation 16)}$$

The comparator 310 will operate according to the first and second output voltages $V_p$ and $V_n$. For example, when $V_n$ is higher than $V_p$, the output of the comparator 310 will reverse. Thus, from equation 16, it is obvious that $V_{sense} - V_{ref} > K \times V_{BG}/R \times R_3$, when $V_n$ is higher than $V_p$, which means at the comparison point of the comparator 310, $V_{sense} - V_{ref} = K \times V_{BG}/R \times R_3$. Thus, a threshold $K \times V_{BG}/R \times R_3$ is obtained.

Based on this threshold, the comparator 310 could be used to monitor the sense signal $V_{sense}$ which could come from different types of external high voltage MOS transistors and could be much higher than 3.3V. For example, an alarm signal for the monitored external high voltage MOS transistor will be output when the condition $V_{sense} - V_{ref} > K \times V_{BG}/R \times R_3$ is satisfied, since at that point the reverse of the output of the comparator 310 can be observed.

In other words, with the specific configuration of this circuit 300, when $V_{sense} > V_{ref} + K \times V_{BG}/R \times R_3$, the output of the comparator 310 will reverse, although $V_{sense}$ is much higher than 3.3V, i.e. the maximum operating voltage thereof.

According to different application scenarios, this threshold could be easily adjusted by changing the current $I_5$ via setting another factor K or choosing a suitable resistance of the first resistor 302 and the second resistor 303, for example.

The circuit 300 also works when the sum of the reference signal $V_{ref}$ and the $I_5 R_3$ (i.e. $V_{ref} I_5 \times R_3$) is lower than the gate to source voltage $V_{GS}$ of the first MOS transistor $M_3$. In this situation, the first MOS transistor $M_3$ is turned off, no current will flow through the first and the second MOS transistors $M_3$ and $M_4$, and no bias current will be provided by the first and the second MOS transistors $M_3$ and $M_4$, thus $V_p = V_{ref} + I_5 \times R_3$, $V_n = V_{sense}$. The comparator 310 will operate based on $V_p$ and $V_n$, (i.e. $V_{ref} + I_5 \times R_3$ and $V_{sense}$). Therefore, the circuit 200 enables the comparator to compare input signals of low voltages. The threshold $V_{ref}-V_{sense}+K\times V_{BG}/R\times R_3$ is also present in this case.

Figure 4:
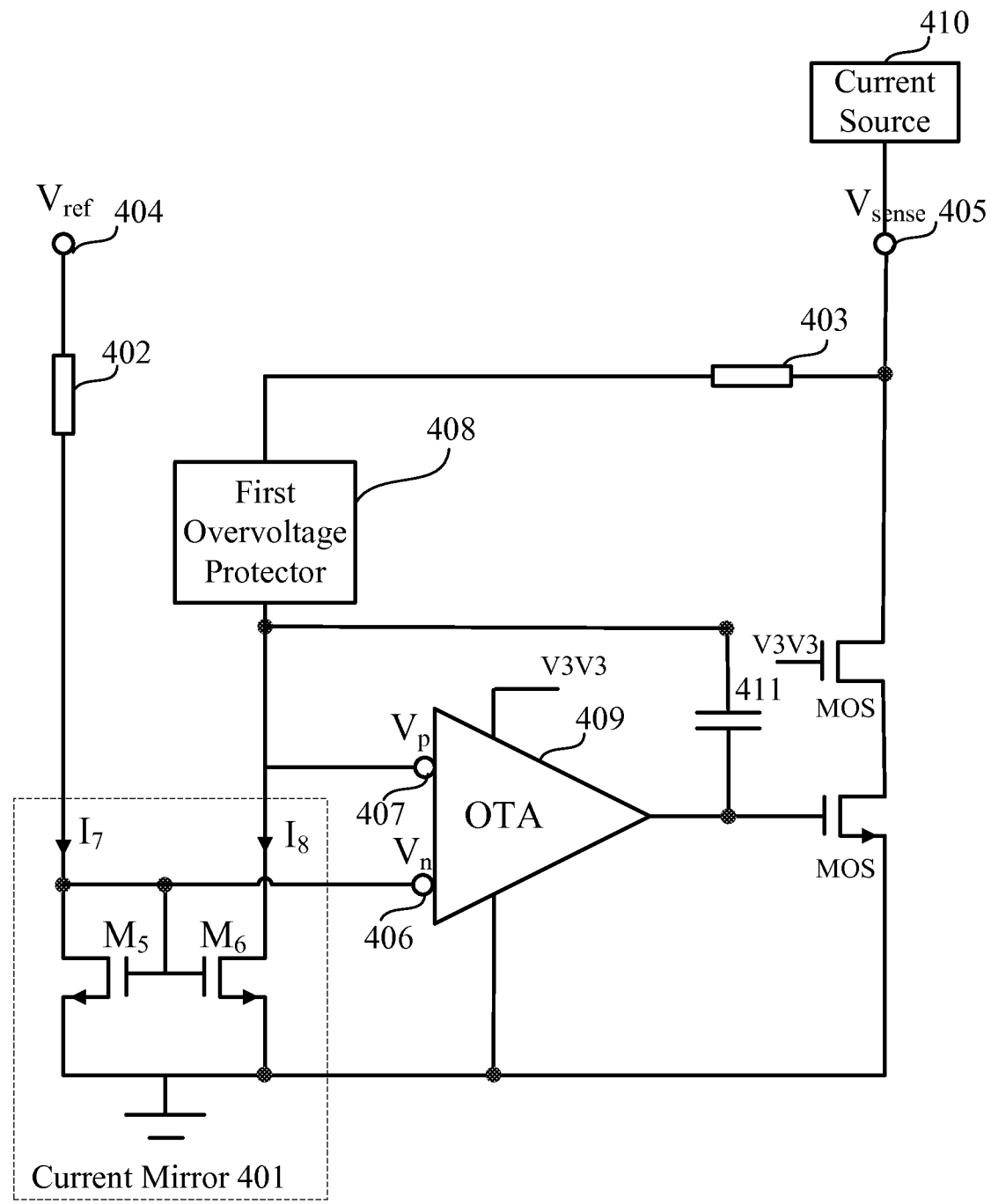
FIG. 4 shows a block diagram of a circuit 400 according to a fourth embodiment of the invention.

FIG. 4 shows a block diagram of a circuit 400 according to a fourth embodiment. The circuit 400 comprises a first level shifter, a second level shifter, a first MOS transistor $M_5$ and a second transistor $M_6$. In this embodiment, the first and the second MOS transistors $M_5$ and $M_6$ form a current mirror 401 (as shown in the dash box). The first level shifter comprises a first resistor 402 coupled between a first input node 404 and a first output node 406, and the second level shifter comprises a second resistor 403 coupled between a second input node 405 and a second output node 407. A current source 410 is coupled to the second input node 405 to provide a bias current, and is configured to pull up the voltage at the second input node 405 so as to build a loop.

According to this embodiment, this circuit 400 further comprises an operational amplifier 409, which is used to amplify a voltage difference between the first output signal and the second output signal. The first input node 404 is configured to receive a reference signal $V_{ref}$ and the second input node 405 is configured to receive a sense signal $V_{sense}$. The first output node 406 is configured to output a first output signal $V_n$, and the second output node 407 is configured to output a second output signal $V_p$.

Preferably, the circuit 400 may further comprise a first overvoltage protector 408 coupled between the second resistor 403 and the current mirror 401, and configured to provide overvoltage protection for the current mirror 401 and the operational amplifier 409. For example, when the sense signal $V_{sense}$ at the second input node 405 is very high, the first overvoltage protector 408 could take over a large portion of the sense signal and protect current mirror 401 and the operational amplifier 409 from failure. For example, the first overvoltage protector 408 may be a MOS transistor. However, it will be appreciated for those skilled in the art, that any other suitable forms of the first overvoltage protector 408, which could implement the similar effects, are also considerable.

In detail, the current mirror 401 comprises the first MOS transistor $M_5$ having a first gate, a first drain and a first source, and the second MOS transistor $M_6$ having a second gate, a second drain and a second source. The first gate is coupled to the second gate and the first drain. The first source and the second source are coupled to a reference voltage line such as ground. The first drain is coupled to the first resistor 402 ($R_5$) to provide the first bias current $I_7$, and the second drain is coupled to the second resistor 403 ($R_6$) via the first overvoltage protector 408 to provide the second bias current $I_8$.

As similarly stated in FIG. 2, the relationship between the first bias current $I_7$ and the second bias current $I_8$ provided by the current mirror 401 is given by the following equation:

$$I_8=\alpha I_7 \quad \text{(equation 17)}$$

Where $\alpha$ is a ratio of the second bias current $I_8$ to the first bias current $I_7$, preferably $\alpha=1$.

In operation, when the reference signal $V_{ref}$ is higher than the gate to source voltage $V_{GS}$ of the first MOS transistor $M_5$, the first MOS transistor $M_5$ is turned on. Then the first bias current $I_7$ and the second bias current $I_8$, i.e. $\alpha I_7$, will be provided to the first resistor 402 and the second resistor 403 respectively by the current mirror 401.

And as also similar stated in the FIG. 2, the relationship between the resistance of the first resistor 402 ($R_5$) and that of the second resistor 403 ($R_6$) is given by the following equation:

$$R_6=R_5/\alpha \quad \text{(equation 18)}$$

Thus, similar to the description with FIG. 2, the first voltage variation on the first resistor 402 is equal to the second voltage variation on the second resistor 403 in this embodiment. Therefore, a same level shift is applied to the reference signal $V_{ref}$ and the sense signal $V_{sense}$ respectively, which may reduce the reference signal $V_{ref}$ and the sense signal $V_{sense}$ into the operable range below 3.3V of the operational amplifier 409.

With the above configuration, similar to the embodiment with reference to FIG. 2, the difference between the first and second output voltages $V_n$ and $V_p$ is as follows:

$$V_n-V_p=V_{ref}-I_7R_5-(V_{sense}-I_8R_6)-V_{ref}-V_{sense} \quad \text{(equation 19)}$$

It means that the difference between the first and the second output voltages $V_n$ and $V_p$ is equal to the difference between the reference signal $V_{ref}$ and the sense signal $V_{sense}$.

The operational amplifier 409 will operate according to the first and second output voltages $V_n$ and $V_p$ and amplify the difference between the first and the second output voltages $V_n$ and $V_p$, i.e. amplify the difference between the reference signal $V_{ref}$ and the sense signal $V_{sense}$.

Thus, although the sense signal $V_{sense}$ and/or the reference signal $V_{ref}$ is much higher than 3.3V, i.e. the maximum operable voltage of the operational amplifier 409, the operational amplifier 409 could still operate with the reference signal $V_{ref}$ and the sense signal $V_{sense}$. Therefore, a voltage operational amplifier capable of amplifying high voltage input signals is achieved. Besides, according to this embodiment, there is a miller capacitor 411 coupled between the input and the output of the operational amplifier 409. Based on the miller effect, the miller capacitor 411 can be of a much small capacitance, which significantly reduces the chip area.

Besides, by choosing suitable resistance of the first resistor 402 and the second resistor 403, and setting the two bias currents correspondingly, i.e. by changing the voltage variation, the operational amplifier could have a wide threshold range, which is beneficial for different application scenarios.

Moreover, the selection of the reference signal $V_{ref}$ could be based on practical applications, such as the high voltage MOS transistor to be monitored, and it could be easily adjusted by the technician according to different application scenarios.

The circuit 400 also works when the reference signal $V_{ref}$ is lower than the gate to source voltage $V_{GS}$ of the first MOS transistor $M_5$. In this situation, the first MOS transistor $M_5$ is turned off, no current will flow through the first and the second MOS transistors $M_5$ and $M_6$, and no bias current will be provided by the first and the second MOS transistor $M_5$ and $M_6$, thus $V_n=V_{ref}$, $V_p=V_{sense}$. The operational amplifier 409 will operate based on $V_n$ and $V_p$, (i.e. $V_{ref}$ and $V_{sense}$). Therefore, the circuit 400 enables the operational amplifier to amplify input signals of low voltages.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit comprising:
   a current mirror configured to generate a first bias current and a second bias current, said second bias current proportional to the first bias current with a first ratio;

a first level shifter having a first input node configured to receive a reference input signal and having a first output node, said first level shifter coupled to the current mirror at said first output node and configured to apply a first voltage variation to the reference input signal in response to the first bias current so as to output a first output signal at said first output node;

a second level shifter having a second input node configured to receive a sense input signal and having a second output node, said second level shifter coupled to the current mirror at said second output node and configured to apply a second voltage variation in association with the first voltage variation to the sense input signal in response to the second bias current so as to output a second output signal at said second output node;

an output circuit coupled to receive the first and second output signals and generate an output in response thereto; and a first overvoltage protector coupled between the second level shifter and an input of the output circuit and configured to provide overvoltage protection for the output circuit.

2. The circuit of claim 1, wherein the first level shifter comprises a first resistor coupled between the first input node and the first output node, and the second level shifter comprises a second resistor coupled between the second input node and the second output node.

3. The circuit of claim 2, wherein a resistance of the second resistor is proportional to that of the first resistor with a reciprocal of the first ratio.

4. The circuit of claim 1, further comprising a variable current supply configured to provide a variable current to the current mirror to change the second voltage variation in relation to the first voltage variation.

5. The circuit of claim 1, further comprising a second overvoltage protector coupled between the second level shifter and an input of the current mirror, the second overvoltage protector configured to provide overvoltage protection for the current mirror.

6. The circuit of claim 1, wherein the current mirror comprises:
   a first MOS transistor having a first gate, a first drain and a first source, and
   a second MOS transistor having a second gate, a second drain and a second source,
   wherein the first gate is coupled to the second gate and the first drain, the first source and the second source are coupled to a reference voltage line, and the first drain is coupled to the first level shifter to at least partially provide the first bias current, and the second drain is coupled to the second level shifter to provide the second bias current.

7. The circuit of claim 1, wherein the output circuit comprises a comparator configured to compare the first output signal with the second output signal.

8. The circuit of claim 7, wherein the first overvoltage protector is coupled between the second level shifter and an input of the comparator.

9. The circuit of claim 1, wherein the output circuit comprises an operational amplifier for amplifying a voltage difference between the first output signal and the second output signal.

10. A circuit, comprising:
    a current mirror configured to generate a first bias current and a second bias current, said second bias current proportional to the first bias current with a first ratio;
    a first level shifter having a first input node configured to receive a reference input signal and having a first output node, said first level shifter coupled to the current mirror at said first output node and configured to apply a first voltage variation to the reference input signal in response to the first bias current so as to output a first output signal at said first output node;
    a second level shifter having a second input node configured to receive a sense input signal and having a second output node, said second level shifter coupled to the current mirror at said second output node and configured to apply a second voltage variation in association with the first voltage variation to the sense input signal in response to the second bias current so as to output a second output signal at said second output node; and
    a variable current supply configured to provide a variable current to the current mirror at said first output node to change the second voltage variation in relation to the first voltage variation;
    wherein the variable current supply comprises:
       a current source configured to generate a reference current; and
       a current multiplier configured to multiply the reference current in response to a control signal, so as to provide the variable current.

11. A circuit, comprising:
    a first input node configured to receive a reference input signal;
    a second input node configured to receive a sense input signal;
    a first output node;
    a second output node;
    a first resistive circuit coupled between the first input node and first output node;
    a second resistive circuit coupled between the second input node and the second output node;
    a current mirror circuit having an input coupled to the first output node and an output coupled to the second output node;
    an output circuit having a first input and second input and configured to generate an output in response thereto, the first input coupled to the first output node; and
    an overvoltage protection circuit coupled between the second output node and the second input of the output circuit.

12. The circuit of claim 11, wherein the current mirror circuit functions to amplify an input current received at the input to generate an output current at the output by an amplification factor.

13. The circuit of claim 12, where the resistance of the first resistive circuit divided by the resistance of the second resistive circuit is substantially equal to the amplification factor.

14. The circuit of claim 11, further comprising an additional overvoltage protection circuit coupled between the second output node and the output of the current mirror.

15. The circuit of claim 11, wherein the output circuit comprises a comparator circuit having a first input coupled to the first output and a second input coupled through the overvoltage protection circuit to the second output.

16. The circuit of claim 11, further comprising a variable current source configured to supply a variable current to the first output node.

17. The circuit of claim 16, wherein the variable current source is response to a control signal controlling a current multiplication operation to generate the variable current from a fixed reference current.

18. The circuit of claim 11, wherein the output circuit comprises a differential amplifier having a first input coupled to the first output and a second input coupled through the overvoltage protection circuit to the second output.

19. A circuit, comprising:
- a first input node configured to receive a reference input signal;
- a second input node configured to receive a sense input signal;
- a first output node;
- a second output node;
- a first resistive circuit coupled between the first input node and first output node;
- a second resistive circuit coupled between the second input node and the second output node;
- a current mirror circuit having an input coupled to the first output node and an output coupled to the second output node;
- a comparator circuit having a first input coupled to the first output and a second input coupled to the second output; and
- an overvoltage protection circuit coupled between the second output and the second input of the comparator circuit.

20. A circuit, comprising:
- a first input node configured to receive a reference input signal;
- a second input node configured to receive a sense input signal;
- a first output node;
- a second output node;
- a first resistive circuit coupled between the first input node and first output node;
- a second resistive circuit coupled between the second input node and the second output node;
- a current mirror circuit having an input coupled to the first output node and an output coupled to the second output node;
- a differential amplifying circuit having a first input coupled to the first output and a second input coupled to the second output; and
- a capacitor coupled between an output of the differential amplifying circuit and one of the first and second inputs of the differential amplifying circuit.

* * * * *